(12) United States Patent
Yang et al.

(10) Patent No.: US 9,840,620 B2
(45) Date of Patent: Dec. 12, 2017

(54) HALOGEN-FREE RESIN COMPOSITION AND USES THEREOF

(71) Applicant: SHENGYI TECHNOLOGY CO., LTD., Guangdong (CN)

(72) Inventors: Hu Yang, Guangdong (CN); Yueshan He, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/022,154

(22) PCT Filed: Mar. 21, 2014

(86) PCT No.: PCT/CN2014/073834
§ 371 (c)(1),
(2) Date: Mar. 15, 2016

(87) PCT Pub. No.: WO2015/120650
PCT Pub. Date: Aug. 20, 2015

(65) Prior Publication Data
US 2016/0237278 A1    Aug. 18, 2016

(30) Foreign Application Priority Data
Feb. 14, 2014   (CN) .......................... 2014 1 0052018

(51) Int. Cl.
| | | |
|---|---|---|
| C08L 79/02 | (2006.01) | |
| B32B 15/08 | (2006.01) | |
| B32B 15/20 | (2006.01) | |
| B32B 27/20 | (2006.01) | |
| B32B 27/28 | (2006.01) | |
| C08G 14/06 | (2006.01) | |
| C08L 61/34 | (2006.01) | |
| C08J 5/24 | (2006.01) | |
| C08L 71/12 | (2006.01) | |
| H05K 1/03 | (2006.01) | |
| H05K 3/02 | (2006.01) | |

(52) U.S. Cl.
CPC .............. *C08L 79/02* (2013.01); *B32B 15/08* (2013.01); *B32B 15/20* (2013.01); *B32B 27/20* (2013.01); *B32B 27/285* (2013.01); *C08G 14/06* (2013.01); *C08J 5/24* (2013.01); *C08L 61/34* (2013.01); *C08L 71/126* (2013.01); *B32B 2264/102* (2013.01); *B32B 2307/306* (2013.01); *B32B 2307/3065* (2013.01); *C08J 2371/12* (2013.01); *C08J 2379/02* (2013.01); *C08J 2425/10* (2013.01); *C08J 2471/12* (2013.01); *C08L 2201/02* (2013.01); *C08L 2201/22* (2013.01); *C08L 2205/03* (2013.01); *H05K 1/0373* (2013.01); *H05K 3/022* (2013.01); *H05K 2201/012* (2013.01)

(58) Field of Classification Search
CPC ............ C08L 71/126; C08L 79/02; C08J 5/24
USPC .................................................. 525/132, 186
See application file for complete search history.

(56) References Cited

U.S. PATENT DOCUMENTS

2008/0171817 A1    7/2008   Peters et al.

FOREIGN PATENT DOCUMENTS

| CN | 101544841 A | 9/2009 |
|---|---|---|
| CN | 101589109 A | 11/2009 |
| CN | 102093666 A | 6/2011 |
| CN | 102161823 A | 8/2011 |
| CN | 102807658 A | 12/2012 |
| CN | 102850726 A | 1/2013 |
| CN | 103102484 A | 5/2013 |
| CN | 102977551 A | 12/2014 |
| CN | 103265791 A | 4/2015 |
| EP | 2241589 A2 | 10/2010 |
| EP | 2657296 A1 | 10/2013 |
| EP | 3037479 A1 | 6/2016 |

OTHER PUBLICATIONS

Guangdong Shengyi Science Tech Co., Ltd., An 2013-K43178, XP002764790, & CN102977551A, Thomson Scientific. 2013. Abstract; claims 1-10.
Extended European Search Report for Application 14882269.5-1303, PCT/CN2014/073834, dated Dec. 23, 2016, 18 pgs., European Patent Office, Germany.
International Search Report, PCT/CN2014/073834, dated Jul. 8, 2014.

*Primary Examiner* — Edward Cain
(74) *Attorney, Agent, or Firm* — McDonald Hopkins LLC

(57) ABSTRACT

Disclosed are a halogen-free resin composition, and a prepreg and a laminate prepared by using the same. The halogen-free resin composition comprises the following components according to organic solid matters by weight parts: (A) 40-80 parts by weight of allyl modified benzoxazine resin; (B) 10-20 parts by weight of hydrocarbon resin; (C) 10-40 parts by weight of allyl modified polyphenylene oxide resin; (D) 0.01-3 parts by weight of initiating agent; (E) 10-100 parts by weight of filler; and (F) 0-80 parts by weight of phosphoric flame retardant. The prepreg and the laminate prepared by using the halogen-free resin composition have lower dielectric constant and lower dielectric loss tangent value, higher peeling strength, higher glass transition temperature, excellent heat resistance and good flame retardant effect.

19 Claims, No Drawings

HALOGEN-FREE RESIN COMPOSITION AND USES THEREOF

CROSS-REFERENCE TO RELATED APPLICATION

This application is a 35 U.S.C. 371 national stage filing of PCT Application No. PCT/CN2014/073834, filed on Mar. 21, 2014, which claims priority to Chinese Patent Application No. 201410052018.6, filed on Feb. 14, 2014, both of which are incorporated herein in their entirety by reference.

TECHNICAL FIELD

The present invention belongs to the field of preparation technique of a copper-clad laminate, and relates to a halogen-free resin composition and uses thereof, especially to a halogen-free resin composition, and a resin varnish, a prepreg, a laminate and a copper-clad laminate prepared by using the halogen-free resin composition.

BACKGROUND ART

The traditional copper-clad laminate used for printed circuit mainly utilizes brominated epoxy resin and achieves flame retardant function by bromine. But in recent years, carcinogen such as dioxins, dibenzofurans and others are detected in the combustion products of wastes of electrical and electronic equipment containing halogen such as bromine, chlorine etc. Meanwhile, halogen-containing products may release highly toxic hydrogen halide during combustion process. In addition, two environmental protection directives of the European Union "Directive on the waste electrical and electronic equipment" and "Directive on the restriction of the use of certain hazardous substances in electrical and electronic equipment" were officially implemented on Jul. 1, 2006. Due to the non-environmental protection property of the combustion products of the halogen-containing products and the implementation of the two environmental protection directives, the development of halogen-free flame retardant copper-clad laminate has become a hot topic in the related industry field, and each copper-clad laminate manufacturer has launched their own halogen-free flame retardant copper-clad laminate in succession.

In recent years, with the development of high performance, high function and networking of computers and information communication equipment, in order to convey at high speed and treat large capacity information, the operation signal tends to be high frequency, and thus requirements on the materials of circuit board are put forward. The current materials used for printed circuit substrate widely use epoxy resins with excellent adhesion property, however, the epoxy resin circuit substrate generally has a high dielectric constant and a high dielectric loss angle tangent value (dielectric constant is greater than 4, dielectric loss angle tangent value is about 0.02), and the high frequency characteristic thereof is insufficient, thus it cannot adapt to the requirements of signal of high frequency. Therefore, a resin with excellent dielectric property, i.e., a resin with a low dielectric constant and a low dielectric loss angle tangent value, must be developed. For a long time, those skilled in the art have studied thermoset resins of polybutadiene or a copolymer of polybutadiene and styrene having excellent dielectric property.

WO97/38564 utilizes a circuit substrate made from non-polar tetramer of styrene and butadiene and divinyl benzene with aluminum magnesium silicate filler being added and glass fiber cloth as a reinforcing material. Although the dielectric property thereof is excellent, the heat resistance of the substrate is very poor, the glass transition temperature thereof is only about 100° C., the thermal expansion coefficient thereof is very large, and thus it is difficult to meet the requirement of high temperature (240° C.) of the lead-free manufacturing process in the PCB manufacturing process.

U.S. Pat. No. 5,571,609 utilizes a circuit substrate made by coordinating 1,2-polybutadiene resin or polyisobutadiene having a low molecular weight less than 5000 with a copolymer of butadiene and styrene having a high molecular weight, with the addition of a large amount of silica powder as a filler, and glass fiber cloth as a reinforcing material. Although the dielectric property thereof is excellent, due to the use of components having a high molecular weight in the patent to improve the hand-sticky condition of a prepreg, the processing properties during manufacturing the prepreg become poor; in addition, since the proportion of benzene ring having a rigid structure in the resin molecules of the whole resin system is very low and the cross-linked chains mainly consist of methylene with a very low rigidity, the prepared board has a poor rigidity and the flexural strength thereof is very low.

U.S. Pat. No. 6,569,943 utilizes a circuit substrate made from vinyl-terminated amine modified liquid polybutadiene resin, with the addition of a large amount of monomer (dibromostyrene) having a low molecular weight as a curing agent and a diluent, and impregnated glass fiber cloth. Although the dielectric property thereof is excellent, since the resin system is liquid at room temperature, it cannot be made into a non-hand-sticky prepreg, so it is very difficult to use the conventional prepreg stacking process when pressing moulding the board, making the technical operation difficult.

CN1280337C uses unsaturated double bond terminated polyphenylene oxide resin, and utilizes vinyl monomers (such as dibromostyrene) with a low molecular weight as a curing agent. However, since the boiling point of these low molecular weight monomers is low, these monomers evaporate away during the drying process of making a prepreg by impregnating glass fiber cloth, and thus it is difficult to guarantee the adequate amount of the curing agent. In addition, although this patent mentions that polybutadiene type resins can be used to change the viscosity of the system, but it does not explicitly put forward using polybutadiene type resins having polar groups and using polybutadiene type resins having polar groups to improve peeling strength.

CN101544841B uses a hydrocarbon resin with a molecular weight lower than 11000 and a vinyl content higher than 60% as the main material, and uses allyl modified phenolic resin to improve the sticky property of the prepreg. There is a certain promotion in peeling strength, but the heat resistance of the cured system is low, and the copper-clad laminate has a higher failure risk of delamination during the PCB processing.

A system with hydrocarbon resin as the main material has a low adhesion to metal and a low heat resistance, which brings a greater failure risk to the PCB processing in the downstream of manufacturing copper-clad laminate.

CONTENTS OF THE INVENTION

In view of the problems existing in the prior art, one of the purposes of the present invention lies in providing a halogen-free resin composition. A prepreg and a laminate prepared by using the halogen-free resin composition have lower dielectric constant and lower dielectric loss tangent value, higher peeling strength, higher glass transition temperature, good heat resistance and excellent flame retardant effect.

In order to achieve this purpose, the present invention employs the following technical solutions:

A halogen-free resin composition comprising the following components according to organic solid matters by weight parts:

(A) 40-80 parts by weight of allyl modified benzoxazine resin;

(B) 10-20 parts by weight of hydrocarbon resin;

(C) 10-40 parts by weight of allyl modified polyphenylene oxide resin;

(D) 0.01-3 parts by weight of initiating agent.

The content of component (A) allyl modified benzoxazine resin is, for example, 42 parts by weight, 44 parts by weight, 46 parts by weight, 48 parts by weight, 50 parts by weight, 52 parts by weight, 54 parts by weight, 56 parts by weight, 58 parts by weight, 60 parts by weight, 62 parts by weight, 64 parts by weight, 66 parts by weight, 68 parts by weight, 70 parts by weight, 72 parts by weight, 74 parts by weight, 76 parts by weight or 78 parts by weight.

The content of component (B) hydrocarbon resin is, for example, 11 parts by weight, 12 parts by weight, 13 parts by weight, 14 parts by weight, 15 parts by weight, 16 parts by weight, 17 parts by weight, 18 parts by weight or 19 parts by weight.

The content of component (C) allyl modified polyphenylene oxide resin is, for example, 12 parts by weight, 14 parts by weight, 16 parts by weight, 18 parts by weight, 20 parts by weight, 22 parts by weight, 26 parts by weight, 28 parts by weight, 30 parts by weight, 32 parts by weight, 34 parts by weight, 36 parts by weight or 38 parts by weight.

The content of component (D) initiating agent is, for example, 0.03 parts by weight, 0.05 parts by weight, 0.08 parts by weight, 0.1 parts by weight, 0.4 parts by weight, 0.7 parts by weight, 1 parts by weight, 1.3 parts by weight, 1.5 parts by weight, 1.7 parts by weight, 1.9 parts by weight, 2.1 parts by weight, 2.3 parts by weight, 2.5 parts by weight, 2.7 parts by weight or 2.9 parts by weight.

The present invention uses allyl modified benzoxazine resin as the main material to provide excellent heat resistance and good electrical property for the system, and further improves the electrical property of the cured system in combination with allyl modified polyphenylene oxide resin and hydrocarbon resin having excellent electrical property. Each component of the resin composition contains carbon-carbon double bond. In the curing process, the initiating agent releases active free radicals under the action of heat, and the double bonds contained in each component of the resin are polymerized in the function of the active free radicals according to the free radical polymerization mechanism, producing a cross-linked macromolecular polymer. Polar groups such as hydroxyl group and the like are not generated during the whole polymerization process. The polymerization product retains maximally the excellent dielectric property and dielectric loss value of the raw materials. A bonding sheet prepared by using the halogen-free high frequency resin composition of the present invention has lower dielectric constant and lower dielectric loss tangent value, higher peeling strength, higher glass transition temperature, excellent heat resistance and good flame retardant effect. A copper-clad laminate prepared by using said bonding sheet has lower dielectric constant and lower dielectric loss tangent value, higher peeling strength, higher glass transition temperature, excellent heat resistance and good flame retardant effect.

Preferably, on the basis of the technical solution provided by the present invention, the component (A) allyl modified benzoxazine resin is selected from any one of allyl modified bisphenol-A benzoxazine resin, allyl modified bisphenol-F benzoxazine resin, allyl modified dicyclopentadiene phenol benzoxazine resin, allyl modified bisphenol-S benzoxazine resin or diamine benzoxazine resin, or a mixture of at least two of them. Said mixture is, for example, a mixture of allyl modified bisphenol-A benzoxazine resin and allyl modified bisphenol-F benzoxazine resin, a mixture of allyl modified dicyclopentadiene phenol benzoxazine resin and allyl modified bisphenol-S benzoxazine resin, a mixture of diamine benzoxazine resin, allyl modified bisphenol-A benzoxazine resin and allyl modified bisphenol-F benzoxazine resin, a mixture of allyl modified dicyclopentadiene phenol benzoxazine resin, allyl modified bisphenol-S benzoxazine resin and diamine benzoxazine resin.

Preferably, on the basis of the technical solution provided by the present invention, the hydrocarbon resin is a hydrocarbon resin which consists of carbon and hydrogen and has a number average molecular weight less than 11000 and a vinyl content greater than 60% and is liquid at room temperature, preferably is a hydrocarbon resin which has a number average molecular weight less than 7000 and a content of vinyl added at 1,2 position carbon greater than 70% and is liquid at room temperature.

Preferably, on the basis of the technical solution provided by the present invention, the allyl modified polyphenylene oxide resin is an allyl modified polyphenylene oxide resin having a number average molecular weight less than 5000 to ensure it can carry out free radical polymerization reaction with other resins and finally generate a homogeneous modified resin system, and reduce the probability of phase separation of the system and avoid negative impact on the electrical property of the system.

Preferably, on the basis of the technical solution provided by the present invention, the initiating agent is a material which can release active free radicals under the action of heat, and is selected from organic peroxide, preferably any one of dicumyl peroxide, tert-butyl peroxybenzoate or 2,5-bis(2-ethylhexanoylperoxy)-2,5-dimethylhexane, or a mixture of at least two of them. Said mixture is, for example, a mixture of dicumyl peroxide and tert-butyl peroxybenzoate, a mixture of 2,5-bis(2-ethylhexanoylperoxy)-2,5-dimethylhexane and dicumyl peroxide, a mixture of tert-butyl peroxybenzoate and 2,5-bis(2-ethylhexanoylperoxy)-2,5-dimethylhexane, a mixture of dicumyl peroxide, tert-butyl peroxybenzoate and 2,5-bis(2-ethylhexanoylperoxy)-2,5-dimethylhexane.

Preferably, on the basis of the technical solution provided by the present invention, the halogen-free resin composition also comprises (E) filler.

Preferably, on the basis of the technical solution provided by the present invention, the content of the filler is 1-100 parts by weight, for example, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 parts by weight or 95 parts by weight, preferably 10-100 parts by weight.

Preferably, on the basis of the technical solution provided by the present invention, the filler is selected from any one of silicon dioxide, titanium dioxide, strontium titanate, barium titanate, boron nitride, aluminum nitride, silicon carbide or alumina, or a mixture of at least two of them, preferably selected from any one of crystalline silicon dioxide, amorphous silicon dioxide, spherical silicon dioxide, titanium dioxide, strontium titanate, barium titanate, boron nitride, aluminum nitride, silicon carbide or alumina, or a mixture of at least two of them. Said mixture is, for example, a mixture of crystalline silicon dioxide and amorphous silicon dioxide, a mixture of spherical silicon dioxide and titanium dioxide, a mixture of strontium titanate and barium titanate, a mixture of boron nitride and aluminum nitride, a mixture of silicon carbide and alumina, a mixture of crystalline silicon dioxide, amorphous silicon dioxide and spherical silicon dioxide, a mixture of titanium dioxide, strontium titanate and barium titanate, and a mixture of boron nitride, aluminum nitride, silicon carbide and alumina.

Preferably, on the basis of the technical solution provided by the present invention, the filler is silicon dioxide.

Preferably, on the basis of the technical solution provided by the present invention, the median of the particle diameter of the filler is 1-15 μm, for example, 2 μm, 3 μm, 4 μm, 5 μm, 6 μm, 7 μm, 8 μm, 9 μm, 10 μm, 11 μm, 12 μm, 13 μm or 14 μm, preferably 1-10 μm, further preferably 1-5 μm. The filler with a particle size falling into this range has a good dispersion in the resin varnish.

Preferably, on the basis of the technical solution provided by the present invention, the halogen-free resin composition also comprises (F) phosphoric flame retardant.

Preferably, on the basis of the technical solution provided by the present invention, the content of the phosphoric flame retardant is 0-80 parts by weight, not including 0, for example, 0.05 parts by weight, 1 parts by weight, 3 parts by weight, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 72 parts by weight, 74 parts by weight, 76 parts by weight or 78 parts by weight.

Preferably, on the basis of the technical solution provided by the present invention, the phosphoric flame retardant is any one of tri(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl) phosphinobenzene, 10-phenyl-9,10-dihydro-9-oxa-10-phosphaphenanthrene-10-oxide, or polyphenoxyphosphazene and derivatives thereof, or a mixture of at least two of them.

Preferably, on the basis of the technical solution provided by the present invention, the halogen content of the halogen-free resin composition is less than 0.09% by weight, for example, 0.01% by weight, 0.02% by weight, 0.03% by weight, 0.04% by weight, 0.05% by weight, 0.06% by weight, 0.07% by weight or 0.08% by weight.

An exemplary halogen-free resin composition comprises the following components according to organic solid matters by weight parts:

(A) 40-80 parts by weight of allyl modified benzoxazine resin;

(B) 10-20 parts by weight of hydrocarbon resin;

(C) 10-40 parts by weight of allyl modified polyphenylene oxide resin;

(D) 0.01-3 parts by weight of initiating agent;

(E) 1-100 parts by weight of filler;

(F) 0-80 parts of phosphoric flame retardant.

The term "comprise(s)/comprising" used in the present invention means that in addition to the components described, other components which give the halogen-free resin composition different characteristics can also be included. What's more, the term "comprise(s)/comprising" used in the present invention may also be replaced by a closed description as "is/being" or "consist(s) of/consisting of".

For example, the halogen-free resin composition can also comprise a variety of additives, and as specific examples, antioxidant, heat stabilizer, antistatic agent, UV absorber, pigment, coloring agent, or lubricant and others can be listed. These additives can be used alone, and can also be used in the form of a mixture of two or more of them.

The second purpose of the present invention is to provide a resin varnish which is obtained by dissolving or dispersing the above-mentioned halogen-free resin composition in a solvent.

As the solvent of the present invention, there is no particular restriction, and as specific examples, at least any one of acetone, butanone, cyclohexanone, ethylene glycol monomethyl ether, propylene glycol monomethyl ether, propylene glycol monomethyl ether acetate, benzene, toluene and xylene, or a mixture of at least two of them can be listed. The used amount thereof can be determined according to the need, without specific limitation, and an amount making the obtained resin varnish have a viscosity suitable for use is just satisfactory.

An exemplary conventional method for preparing the halogen-free resin composition varnish is: first adding the solid matters of the abovementioned components to an appropriate container, and then adding the solvent, stirring until the solid matters being completely dissolved, then adding an appropriate filler, and finally adding a liquid resin and an initiating agent, and continuing to stir evenly. When using, the solid content of the solution can be appropriately adjusted to 65-75% by a solvent to obtain a varnish.

The third purpose of the present invention is to provide a prepreg comprising a reinforcing material and the halogen-free resin composition as mentioned above which is attached on the reinforcing material after impregnation and drying. The prepreg has lower dielectric constant and lower dielectric loss tangent value, higher peeling strength, higher glass transition temperature, excellent heat resistance, and good flame retardant effect.

The reinforcing material is a reinforcing material disclosed in the prior art, such as nonwoven fabrics or woven fabrics, for example, natural fibers, organic synthetic fibers and inorganic fibers, preferably electronic grade glass fiber cloth.

The abovementioned resin varnish is used to impregnate the reinforcing material—fabrics such as glass fiber cloth and the like or organic fabrics. The impregnated reinforcing material is dried in an oven at 170° C. for 5-8 min to obtain a prepreg used for printed circuit.

The fourth purpose of the present invention is to provide a laminate comprising at least one sheet of the prepreg as mentioned above.

The fifth purpose of the present invention is to provide a copper-clad laminate, which comprises at least one superimposed prepreg as mentioned above and a copper foil overlaying at one side or both sides of the superimposed prepreg. The copper-clad laminate has lower dielectric constant and lower dielectric loss tangent value, higher peeling strength, higher glass transition temperature, excellent heat resistance, and good flame retardant effect.

An exemplary method for preparing the copper-clad laminate is that: four sheets of prepregs mentioned above and two sheets of copper foils each of which have a thickness of 1 ounce (35 μm thick) are superimposed together, and are laminated through a hot press machine and thus are pressed into a double-sided copper-clad laminate. The lamination of the copper clad foils should meet the following requirements: 1. the temperature increasing rate for the lamination is usually controlled at 1.0-3.0° C./min when the temperature of the materials is 80-220° C.; 2. the pressure conducted for the lamination is a full pressure which is about 300 psi when the temperature of the outer materials is 80-100° C.; 3. when curing, the temperature of the materials is controlled at 220° C. and the temperature is kept for 120 min; the metal foil covered can also be, in addition to a copper foil, a nickel foil, an aluminum foil and a SUS foil, and the material of the metal foil is not limited.

Compared with the prior art, the present invention has the following beneficial effects:

The present invention makes allyl modified benzoxazine resin as the main materials to provide excellent heat resistance and good electrical property for the system, and further improves the electrical property of the curing system in combination with allyl modified polyphenylene oxide resin and hydrocarbon resin having excellent electrical property. Each component of the resin composition contains carbon-carbon double bond. In the curing process, the initiating agent releases active free radicals under the action of heat, and the double bonds contained in each component of the resin are polymerized in the function of active free radicals according to the free radical polymerization mechanism, producing a cross-linked macromolecular polymer. Polar groups such as hydroxyl group and the like are not generated during the whole polymerization process. The polymerization product retains maximally the excellent dielectric properties and dielectric loss value of the raw materials. A bonding sheet prepared by using the halogen-free high frequency resin composition of the present invention has lower dielectric constant and lower dielectric loss tangent value, higher peeling strength, higher glass transition temperature, excellent heat resistance and good flame retardant effect. A copper-clad laminate prepared by using said bonding sheet has lower dielectric constant and lower dielectric loss tangent value, higher peeling strength, higher glass transition temperature, excellent heat resistance and good flame retardant effect.

EMBODIMENTS

Hereinafter, the technical solution of the present application is further described by the specific embodiments.

The formulas of the composition of examples are shown in Table 1. The physical data of copper-clad laminates used in printed circuit boards prepared by the aforesaid method, such as dielectric constant, dielectric loss factor, and flame retardancy are shown in Table 2 and Table 3.

The specific components of the halogen-free high frequency resin composition are as follows:

(A) allyl modified benzoxazine resin
A-1 allyl modified bisphenol-A benzoxazine resin
A-2 allyl modified dicyclopentadiene phenol benzoxazine resin
A-3 allyl modified bisphenol-F benzoxazine resin
(B) hydrocarbon resin
B-1 styrene butadiene resin (product model: Ricon 104H, Sartomer)
B-2 styrene butadiene resin (product model: Ricon 153H, Sartomer)
(C) allyl modified polyphenylene oxide resin (product model: PP501, Jinyi Chemical Industry Co., Ltd., Taiwan)
(D) initiating agent: dicumyl peroxide (Gaoqiao Petrochemical Company, Shanghai)
(E) filler: spherical silica powder (trade name: SFP-30M, Denki Kagaku Kogyo Kabushiki Kaisha);
(F) flame retardant: polyphenoxyphosphazene compound, SPB-100 (trade name of Otsuka Chemical Co., Ltd., Japan)

TABLE 1

Formulas of Examples and Comparative Examples

| | Examples | | | | | | Comparative Examples | | | | |
|---|---|---|---|---|---|---|---|---|---|---|---|
| | 1 | 2 | 3 | 4 | 5 | 6 | 1 | 2 | 3 | 4 | 5 |
| A-1 | 40 | | 50 | | | 40 | — | — | | 50 | 10 |
| A-2 | | 80 | | 70 | | | 80 | — | | | |
| A-3 | | | | | 50 | | — | — | | | |
| B-1 | 20 | | | 10 | | | — | 35 | | | |
| B-2 | | 10 | 15 | | 15 | 50 | — | — | 10 | 15 | 80 |
| C | 40 | 10 | 35 | 20 | 35 | 10 | 20 | 65 | 10 | | 10 |
| D | 0.05 | 1 | 3 | 0.7 | 2.5 | 3 | 0.7 | 0.7 | 1 | 3 | 2 |
| E | 10 | 60 | 30 | 40 | 20 | 100 | 40 | 40 | 60 | 30 | 40 |
| F | 10 | 5 | 5 | 5 | 10 | 80 | 5 | 5 | 5 | 5 | 50 |
| Benzoxazine resin * | | | | | | | | | 80 | | |
| Polyphenylene oxide resin ** | | | | | | | | | | | 35 |

Note:
1. all data in the table are based on the weight parts of solid components;
2. * is a conventional dicyclopentadiene benzoxazine resin not containing an allyl group;
3. ** is a conventional polyphenylene oxide resin not containing an allyl group.

TABLE 2

Physical property data for each example

| | Examples | | | | | |
|---|---|---|---|---|---|---|
| | 1 | 2 | 3 | 4 | 5 | 6 |
| Glass transition temperature Tg (DSC, ° C.) | 175 | 185 | 175 | 185 | 175 | 145 |
| Peeling strength PS (N/mm) | 1.3 | 1.2 | 1.23 | 1.35 | 1.2 | 1.2 |
| combustibility (UL94) | V-0 | V-0 | V-0 | V-0 | V-0 | V-0 |
| Thermal stratification time T-288 (minutes) | >45 | >60 | >45 | >60 | >45 | >30 |
| Coefficient of thermal expansion CTE in Z axis direction (TMA) (30-260° C.)% | 2.4 | 2.0 | 2.2 | 2.1 | 2.2 | 3.0 |
| Thermal decomposition temperature Td (TGA, ° C.) | 375 | 380 | 400 | 410 | 380 | 375 |
| Water absorption (%) | 0.10 | 0.08 | 0.10 | 0.08 | 0.10 | 0.08 |
| Dielectric loss angle tangent Df (1 GHZ) | 0.0032 | 0.0026 | 0.0036 | 0.0028 | 0.0038 | 0.0032 |
| Dielectric constant Dk (1 GHZ) | 3.56 | 3.66 | 3.71 | 3.69 | 3.59 | 3.7 |
| Halogen content test (%)  Cl | 0.04 | 0.05 | 0.04 | 0.05 | 0.004 | 0.05 |
| Halogen content test (%)  Br | 0 | 0 | 0 | 0 | 0 | 0 |

TABLE 3

| | Comparative Examples | | | | |
|---|---|---|---|---|---|
| | 1 | 2 | 3 | 4 | 5 |
| Glass transition temperature Tg (DSC, ° C.) | 175 | 130 | 170 | 140 | 110 |
| Peeling strength PS (N/mm) | 1.3 | 0.5 | 1.2 | 0.9 | 0.6 |
| Combustibility (UL94) | V-0 | V-1 | V-0 | V-0 | V-1 |
| Thermal stratification time T-288 (minutes) | >60 | >5 | >60 | >45 | >5 |
| Coefficient of thermal expansion CTE in Z axis direction (TMA) (30-260° C.)% | 2.2 | 2.6 | 2.0 | 2.2 | 3.0 |
| Thermal decomposition temperature Td (TGA, ° C.) | 395 | 370 | 410 | 380 | 380 |
| Water absorption (%) | 0.08 | 0.07 | 0.10 | 0.10 | 0.07 |
| Dielectric loss angle tangent Df (1 GHZ) | 0.0042 | 0.0021 | 0.0065 | 0.0052 | 0.0025 |
| Dielectric constant Dk (1 GHZ) | 3.90 | 3.47 | 3.90 | 3.7 | 3.4 |
| Halogen content test (%)  Cl | 0.05 | 0.004 | 0.005 | 0.005 | 0.005 |
| Halogen content test (%)  Br | 0 | 0 | 0 | 0 | 0 |

From the physical property data in Table 2, it can be seen that the copper-clad laminates prepared according to Examples 1-5 have excellent dielectric property and higher glass transition temperature. These systems have a significantly improved peeling strength and T288 while maintaining electrical properties. These systems can achieve V-0 standard in flame retardant test UL94 in the range of halogen-free standard requirements, and have low thermal expansion coefficient, high thermal decomposition stability, low water absorption, and a halogen content less than 0.09%, which meet the requirements of environmental protection.

In comparison with Example 4, the system of Comparative Example 1 lacks hydrocarbon resin component and has a higher dielectric loss and a higher dielectric constant; the adhesion, Tg, heat resistance and flame retardancy of the system of Comparative Example 2 all increased significantly due to the lack of allyl modified benzoxazine component.

Comparative Examples 3 and 4 use a common dicyclopentadiene benzoxazine resin not containing a double bond and a polyphenylene oxide resin not containing a double bond of allyl group, respectively. During the curing reaction, the three kinds of resins cannot react according to the free radical polymerization mechanism, and the finally obtained polymer system would have a phase separation structure, causing a negative effect on the electrical property of the system. In comparison with Example 2, due to the addition of allyl modified dicyclopentadiene benzoxazine resin, the resin components in the system can form a homogeneous cured component by free radical polymerization under the action of a promoter, and the dielectric loss and dielectric constant thereof are significantly reduced.

Comparative Example 5 brings a very large negative impact on Tg, heat resistance, adhesion and flame retardancy of the cured system due to the large amount of the hydrocarbon resin.

In summary, the special type benzoxazine resin, polyphenylene oxide resin, hydrocarbon resin, curing agent and other components used for the halogen-free high frequency resin composition of the present invention make the halogen-free high frequency resin composition have good synergistic characteristics. In addition to phosphorus element used for flame retardant, the content of halogen is below 0.09%, and thus achieving environmental protection standards. Further, the bonding sheet prepared by using the halogen-free high frequency resin composition has excellent electrical property, higher glass transition temperature, good heat resistance, good flame retardant effect and lower water absorption.

Test methods for the above characteristics are as follows:

Glass transition temperature (Tg): being tested according to differential scanning calorimetry (DSC) as described by IPC-TM-650 2.4.25.

Peeling strength (PS): the metal cover layer is tested in accordance with the experimental conditions "after thermal stress" in the IPC-TM-650 2.4.8 method.

Combustibility: being tested according to UL 94 vertical combustion method. Thermal stratification time T-288: being tested according to IPC-TM-650 2.4.24.1 method. Coefficient of thermal expansion Z axis CTE (TMA): being tested according to IPC-TM-650 2.4.24. method.

Thermal decomposition temperature Td: being tested according to IPC-TM-650 2.4.26 method.

Water absorption: being tested according to IPC-TM-650 2.6.2.1 method.

Dielectric loss angle tangent and dielectric constant: the dielectric loss angle tangent is tested under 10 GHz according to the resonance method using a strip line, in accordance with IPC-TM-650 2.5.5.9.

Halogen content: being tested according to the IPC-TM-650 2.3.41 method.

The applicant states that: the present application illustrates the detailed methods of the present invention by the above examples, but the present invention is not limited to the detailed methods, that is, it does not mean that the invention must be conducted relying on the above detailed methods. Those skilled in the art should understand that any modification to the present invention, any equivalent replacement of each raw material of the present invention and the addition of auxiliary ingredient, the selection of specific embodiment and the like all fall into the protection scope and the disclosure scope of the present invention.

The invention claimed is:

1. A halogen-free resin composition comprising the following:
   (A) 40-80 parts by weight of allyl modified benzoxazine resin;
   (B) 10-20 parts by weight of hydrocarbon resin;
   (C) 10-40 parts by weight of allyl modified polyphenylene oxide resin; and
   (D) 0.01-3 parts by weight of initiating agent.

2. The halogen-free resin composition according to claim 1, wherein the allyl modified benzoxazine resin is selected from the group consisting of allyl modified bisphenol-A benzoxazine resin, allyl modified bisphenol-F benzoxazine resin, allyl modified dicyclopentadiene phenol benzoxazine resin, or allyl modified bisphenol-S benzoxazine resin, or a mixture of at least two of them.

3. The halogen-free resin composition according to claim 1, wherein the hydrocarbon resin is a hydrocarbon resin which consists of carbon and hydrogen and has a number average molecular weight less than 11000 and a vinyl content greater than 60% and is liquid at room temperature.

4. The halogen-free resin composition according to claim 1, wherein the hydrocarbon resin is a hydrocarbon resin which has a number average molecular weight less than 7000 and a content of vinyl added at 1,2 position carbon greater than 70% and is liquid at room temperature.

5. The halogen-free resin composition according to claim 1 wherein the allyl modified polyphenylene oxide resin is an allyl modified polyphenylene oxide resin having a number average molecular weight less than 5000.

6. The halogen-free resin composition according to claim 1, wherein the initiating agent is selected from organic peroxide.

7. The halogen-free resin composition according to claim 1, wherein the initiating agent is any one of dicumyl peroxide, tert-butyl peroxybenzoate or 2,5-bis(2-ethylhexanoylperoxy)-2,5-dimethylhexane, or a mixture of at least two of them.

8. The halogen-free resin composition according to claim 1, wherein the halogen-free resin composition also comprises (E) filler.

9. The halogen-free resin composition according to claim 8, wherein the content of the filler is 1-100 parts by weight.

10. The halogen-free resin composition according to claim 8, wherein the filler is selected from any one of silicon dioxide, titanium dioxide, strontium titanate, barium titanate, boron nitride, aluminum nitride, silicon carbide or alumina, or a mixture of at least two of them.

11. The halogen-free resin composition according to claim 8, wherein the filler is selected from any one of crystalline silicon dioxide, amorphous silicon dioxide, spherical silicon dioxide, titanium dioxide, strontium titanate, barium titanate, boron nitride, aluminum nitride, silicon carbide or alumina, or a mixture of at least two of them.

12. The halogen-free resin composition according to claim 8, wherein the filler is silicon dioxide.

13. The halogen-free resin composition according to claim 8, wherein the median of the particle diameter of the filler is 1-15μm.

14. The halogen-free resin composition according to claim 1, wherein the halogen-free resin composition also comprises (F) phosphoric flame retardant.

15. The halogen-free resin composition according to claim 14, wherein the content of the phosphoric flame retardant is 0-80 parts by weight, not including 0.

16. The halogen-free resin composition according to claim 14, wherein the phosphoric flame retardant is any one of tri(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl)phosphinobenzene, 10-phenyl-9,10-dihydro-9-oxa-10-phosphaphenanthrene-10-oxide, or polyphenoxyphosphazene and derivatives thereof, or a mixture of at least two of them.

17. The halogen-free resin composition according to claim 1, wherein the halogen content of the halogen free resin composition is less than 0.09% by weight.

18. A resin varnish, wherein the resin varnish is obtained by dissolving or dispersing the halogen-free resin composition according to claim 1 in a solvent.

19. A prepreg, wherein the prepreg comprises a reinforcing material and the halogen-free resin composition according to claim 1 which is attached on the reinforcing material after impregnation and drying.

* * * * *